(12) United States Patent
Renau et al.

(10) Patent No.: US 8,716,682 B2
(45) Date of Patent: *May 6, 2014

(54) APPARATUS AND METHOD FOR MULTIPLE SLOT ION IMPLANTATION

(75) Inventors: Anthony Renau, West Newbury, MA (US); Ludovic Godet, Boston, MA (US); Timothy J. Miller, Ipswich, MA (US); Joseph C. Olson, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/079,369

(22) Filed: Apr. 4, 2011

(65) Prior Publication Data

US 2012/0248328 A1    Oct. 4, 2012

(51) Int. Cl.
*H05H 1/24*    (2006.01)
(52) U.S. Cl.
USPC .................................. 250/492.21; 250/492.3
(58) Field of Classification Search
USPC ................................ 250/492.2–492.22, 492.3
See application file for complete search history.

(56) References Cited

U.S. PATENT DOCUMENTS

| 5,026,997 | A  | * | 6/1991  | Benveniste ............... 250/492.2 |
| 2006/0071183 | A1 | * | 4/2006  | Shibata et al. ........... 250/492.23 |
| 2008/0132046 | A1 | * | 6/2008  | Walther ....................... 438/513 |
| 2008/0317968 | A1 | * | 12/2008 | Singh et al. .................. 427/523 |
| 2009/0227062 | A1 | * | 9/2009  | Sullivan et al. ................ 438/61 |
| 2010/0323508 | A1 | * | 12/2010 | Adibi et al. ................... 438/513 |
| 2011/0124186 | A1 |   | 5/2011  | Renau et al. |
| 2011/0151610 | A1 | * | 6/2011  | Ramappa et al. ............... 438/57 |
| 2012/0112248 | A1 | * | 5/2012  | Wu et al. ....................... 257/255 |

FOREIGN PATENT DOCUMENTS

JP    2006196752 A    7/2006
JP    2009059516 A    3/2009

* cited by examiner

*Primary Examiner* — Nicole Ippolito
*Assistant Examiner* — David E Smith (57) ABSTRACT

An ion implantation system may comprise a plasma source for providing a plasma and a workpiece holder arranged to receive a bias with respect to the plasma to attract ions across a plasma sheath toward the substrate. The system may also include an extraction plate arrangement comprising a multiplicity of different apertures each arranged to provide an ion beam having ions distributed over a range of angles of incidence on the workpiece, wherein a first ion beam extracted from a first aperture has a first beam profile that differs from a second ion beam extracted from a second aperture.

20 Claims, 5 Drawing Sheets

APPARATUS AND METHOD FOR MULTIPLE SLOT ION IMPLANTATION

FIELD

This invention relates to the implantation of workpieces and, more particularly, to a method and apparatus for implantation of workpieces using multiple ion beams.

BACKGROUND

Ion implantation is a standard technique for introducing property-altering impurities into substrates. A desired impurity material is ionized in an ion source, the ions are accelerated to form an ion beam of prescribed energy, and the ion beam is directed at the surface of the substrate. The energetic ions in the beam penetrate into the sub-surface of the substrate material and are embedded into the crystalline lattice of the substrate material to form a region of desired conductivity or material property.

In conventional beamline ion implantation processes, ions are provided toward a substrate in beams that may comprise generally parallel ions. Thus, for a given substrate orientation with respect to the ion beam principle axis, the ions impinge at the same angle of incidence. This facilitates control of implantation of ions into the substrate since for any given substrate orientation, the direction of ion implantation is well characterized. However, when multiple angle implantation is desired, it is necessary to move the substrate orientation or beam direction. Moreover, the ion beam generally covers a wide area of the substrate, requiring masking in order to implant only desired areas.

Figure 1:
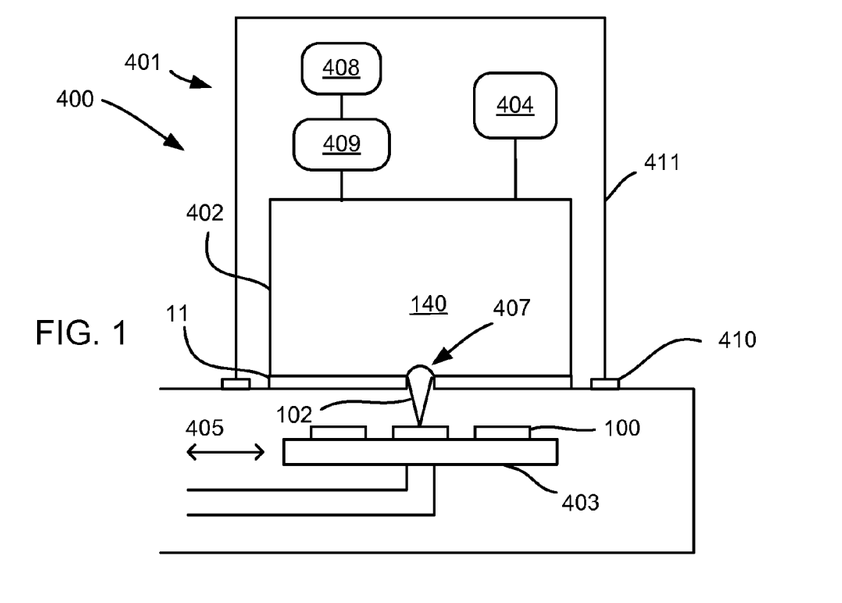
FIG. 1 is a block diagram of a plasma processing apparatus using a single aperture.

Recently, techniques and apparatus have been developed to provide ions to a substrate over a range of angles. FIG. 1 is a block diagram that depicts a plasma processing apparatus that provides ions at multiple angles to a substrate. The system 400 includes a plasma source 401, an extraction plate 11 (or sheath engineering plate), and a process chamber 402. A gas source 404 is connected to the plasma source 401. The plasma source 401 or other components of the system 400 also may be connected to a pump (not shown), such as a turbopump. As illustrated, the plasma source 401 is an RF plasma source with an RF source generator 408 and an RF matching network 409. The plasma source 401 is surrounded by an enclosure 411 and a DC break 410 separates the enclosure 411 from the process chamber 402. The process chamber 402, plasma source 401, or platen 403 may be grounded.

The extraction plate 11 is used to extract ions 102 for implantation into a workpiece (substrate) 100. The extraction plate 11 may be cooled. The plasma source 401 may be biased and a bias power supply (not shown) may be provided to provide a continuous or pulsed bias on the substrate with respect to the plasma 140 to attract the ions 406. The extraction plate 11 may have at least one aperture 407, through which ions 102 are provided to substrate (workpiece) 100. Additional description related processing systems can be found in U.S. patent application Ser. No. 12/417,929, filed Apr. 3, 2009, and issued as U.S. Pat. No. 7,767,977; Ser. No. 12/418,120, filed Apr. 3, 2010; Ser. No. 12/644,103, filed Dec. 22, 2009; and Ser. No. 12/848,354, filed Aug. 2, 2010, each of which is herein incorporated in its entirety by reference.

An ion beam extracted from a plasma using system 400 may be used to simultaneously provide to substrate 100 ions over a range of angles if desired without requiring complicated masking or lithography procedures. In view of the above, it will be appreciated that it may be useful to provide improvements to such a system that facilitate additional capabilities for processing substrates.

SUMMARY

In one embodiment, an ion implantation apparatus comprises a plasma source for providing a plasma and a workpiece holder arranged to receive a bias with respect to the plasma to attract ions across a plasma sheath toward a workpiece. The apparatus may also include an extraction plate assembly comprising a multiplicity of different apertures each arranged to provide an ion beam having ions distributed over a range of angles of incidence on the workpiece, wherein a first ion beam extracted from a first aperture has a first beam profile that differs from a second ion beam extracted from a second aperture.

In another embodiment, a method of processing a substrate comprises providing a first ion beam having a first profile of ions distributed over a range of angles of incidence on the substrate and providing a second ion beam having a second profile of ions distributed over a range of angles of incidence on the substrate wherein the first ion beam has a first beam profile that differs from a second ion beam profile of the second ion beam.

BRIEF DESCRIPTION OF THE DRAWINGS

For a better understanding of the present disclosure, reference is made to the accompanying drawings, which are incorporated herein by reference and in which.

DETAILED DESCRIPTION

Embodiments of a system and method are described herein in connection with implantation of workpieces (substrates). In various embodiments, this system can be used with, for example, semiconductor substrates, bit-patterned media, solid-state batteries, or flat panels. Thus, the invention is not limited to the specific embodiments described below.

In various embodiments, an ion implantation system includes a plasma source and an extraction plate arrangement (also termed extractor) that is arranged to provide multiple ion beams using multiple extraction apertures toward a workpiece (substrate). In various embodiments the extraction plate arrangement may comprise a single extraction plate that includes multiple extraction apertures in which a first aperture differs from a second aperture. Accordingly multiple different ion beams may be provided simultaneously toward a workpiece.

The extraction plate arrangement may be arranged as a plasma sheath modifier wherein the multiple apertures are arranged to modify the shape of a plasma sheath boundary proximate the workpiece. The plasma sheath boundary shape in each aperture may be arranged to extracts ions through the apertures over a range of angles and to thereby provide an ion beams whose ions impact a workpiece over a range of angles.

In various embodiments, the system may be provided with a scanning mechanism to scan the workpiece with respect to an extraction plate arrangement. In some embodiments, the ion implantation system may be arranged to scan a workpiece under multiple different apertures, thus exposing the workpiece to treatment from multiple different ion beams. In accordance with various embodiments, methods of treating a workpiece involve the exposure of a workpiece to multiple different ion beams in a novel and inventive manner. Such treatments may be arranged to optimize a temperature profile in a workpiece, to provide an optimized distribution of angles for ions impinging on a workpiece, and to provide complex patterning of a workpiece, among other features.

Figure 2:
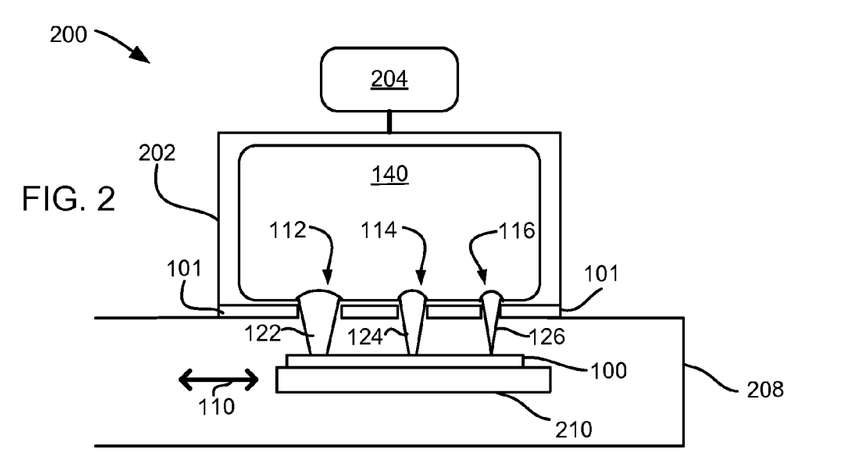
FIG. 2 is a processing system consistent with an embodiment of this disclosure.

FIG. 2 depicts an ion implantation system 200 consistent with an embodiment of this disclosure. System 200 includes a plasma source 204 arranged to generate a plasma 140 in a chamber 202. Plasma source 204 may be an RF plasma source, inductively-coupled plasma (ICP) source, indirectly heated cathode (IHC), helicon, glow discharge source, or other plasma sources known to those skilled in the art. An extraction plate 101 may be arranged along an edge of plasma 140 with multiple apertures 112-116 through which ion beams 122-126 may be extracted. A bias voltage may be applied between workpiece holder 210 and plasma 140 to define an ion energy of ions extracted through apertures 112-116 and impinging on workpiece 100. The workpiece holder 210 may receive a voltage potential that biases the holder 210 with respect to the plasma 140 in different ways. In one embodiment, the workpiece holder may receive a ground potential and a positive voltage may be applied to the plasma (source), while in another embodiment, the workpiece may receive a negative voltage and the plasma (source) may be set at ground potential or at a more positive voltage than the workpiece holder. As illustrated the ion beams 122-126 may vary between one another in at least one characteristic. In particular, the ion beam profile may vary between beams 122, 124, and 126. The term "ion beam profile" is used herein to refer to characteristics of an ion beam that may include, among other features, the ion beam width, the ion beam shape, and the distribution of angles of incidence formed by ions within the ion beam. In some embodiments, the ion beams may vary in width, as suggested by FIG. 2. System 200 also includes a region 208 (which may be a process chamber) that contains a workpiece holder 210 for supporting a workpiece 100. As detailed below, the apertures of extraction plate 101 may be arranged to extract ions from plasma 140 over a range of angles such that ions in beams 122-126 impinge on workpiece 100 over a range of angles of incidence. System 200 may also include a scanning mechanism (not explicitly shown) that provides for workpiece holder 210 to be scanned along a direction 110 with respect to extraction plate 101. In some embodiments, extraction plate 101 may be stationary, while workpiece holder 210 is movable, while in other embodiments, extraction plate 101 may be movable while holder 210 is stationary, while in still other embodiments, both holder 210 and extraction plate 101 may be movable.

In various embodiments, system 200 may be arranged to scan the same portion of a workpiece 100 under more than one of apertures 122-126. In this manner, portions of workpiece 100 may be sequentially exposed to multiple different ion beams, allowing the workpiece to be subjected to varying ion treatments. In some embodiments, this multiple ion beam treatment may be accomplished without otherwise changing operating parameters in system 200. In other words, the plasma operating conditions and workpiece bias may be held constant, while portions of workpiece 100 are scanned under two or more of apertures 112-116. The exposure of the same region of a workpiece to multiple different ion beams may provide a convenient means to tailor the treatment of workpiece 100 in novel ways, as detailed below.

Figure 3A:
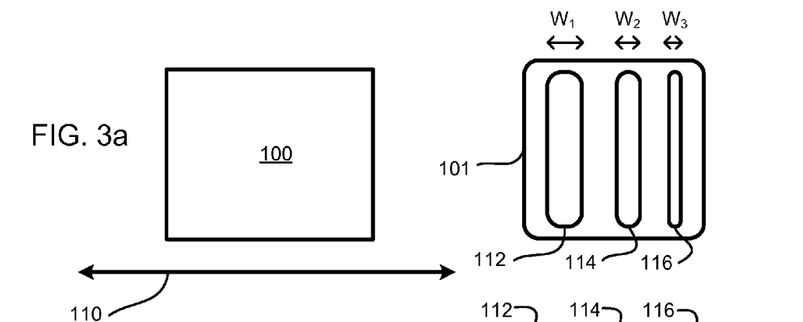
FIGS. 3a and 3b depict plan views of alternative extraction plate embodiments.
Figure 3B:
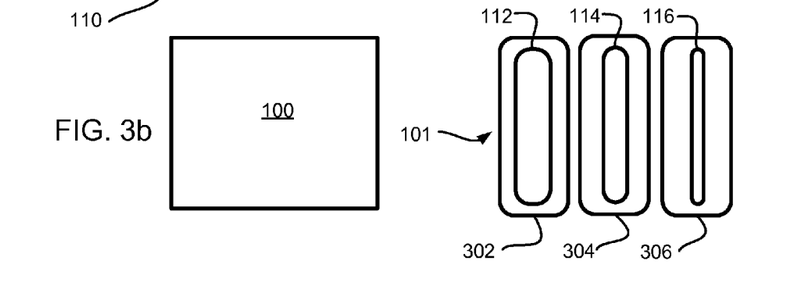

FIGS. 3a and 3b depict a top plan view of alternative embodiments of extraction plate arrangement 101. In FIGS. 3a, and 3b, and in the discussion to follow, extraction plate embodiments may be described that generally exhibit three different apertures. However, the depiction of embodiments having three different apertures is chosen merely to aid in illustration, and embodiments having any amount of apertures numbering two or greater are possible. FIG. 3a depicts an extraction plate 101 that is a single piece that contains three separate apertures 112-116 in which the aperture width varies between apertures. FIG. 3b depicts an extraction plate arrangement 101 that comprises three separate plates 302, 304, 306 each of which includes a single aperture. In both arrangements, the apertures may be scanned in concert with one another along direction 110 such that one or more regions of workpiece 100 are exposed to beams from each of two or more of apertures 112-116 in succession. Moreover, extraction plate arrangement 101 may be an insulator, semiconductor, or conductor. In one embodiment, a wide aperture may have a width of about 10 mm, a medium aperture a width of about 3 mm, and a narrow aperture a width of about 1 mm. Because beams 122-126 may in general vary in properties between one another, the successive exposure to the different beams may afford the ability to treat the substrate 100 in a single scan in a manner not possible using conventional ion beam systems.

In FIGS. 3a, 3b the three apertures 112-116 are depicted as having an elongated slot shape. However, in other embodiments, the apertures may be circular, square, or may have any arbitrary shape, and may comprise any desired number of apertures. Moreover, in various other embodiments a series of different apertures may be arranged in any desired order. For example, a series of three or more different apertures need not be arranged next on one another in order of increasing size. Thus, in one arrangement, in a given scan, a workpiece may be exposed to a large aperture, small aperture, and medium aperture in succession.

Figure 4:
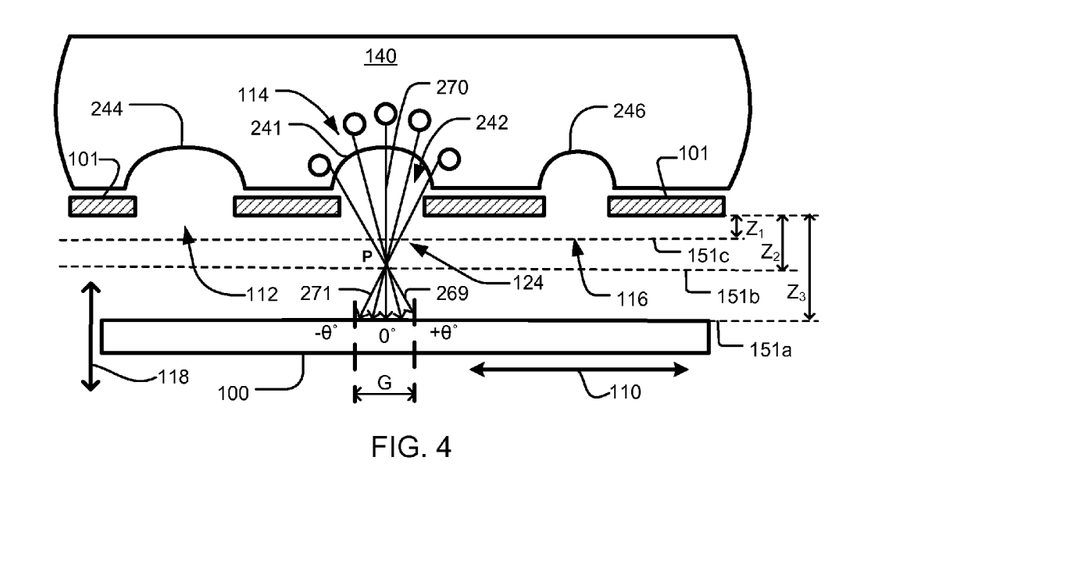
FIG. 4 depicts details of ion beam geometry for an extraction plate embodiment.

FIG. 4 depicts details of ion beam geometry for ion beams produced by aperture plate 101 according to various embodiments. The extraction plate 101 is configured to modify an electric field within the plasma sheath 242 to control a shape of a boundary 241 proximate aperture 114 between plasma 140 and the plasma sheath 242. In this example, the plasma sheath boundary (portion) 241 has a convex shape with respect to the plane of substrate 100. Similarly, the local shape of the plasma sheath boundary is also modified proximate apertures 112 and 116 to form convex plasma sheath boundary portions 244 and 246, respectively. For clarity, in FIG. 4, only ions extracted from boundary 241 are illustrated. However, in operation, ions may also be extracted through the other apertures as illustrated in the other figures. Ions 124 that are attracted from the plasma 140 across the plasma sheath 242 may strike the workpiece 100 at a large range of incident angles. Several different trajectories of ions accelerated from boundary portion 241 are illustrated, however ions accelerated from portions 242 and 246 may also form a range of incident angles.

Ions 124 may be attracted from the plasma 140 across the plasma sheath 242 by different mechanisms. In one instance, the workpiece 100 is biased to attract ions 124 from the plasma 140 across the plasma sheath 242. The ions 124 may be a p-type dopant, an n-type dopant, hydrogen, a noble gas, or other species known to those skilled in the art.

When the workpiece 100 is biased, for example, the ions 124 are attracted across the plasma sheath 242 through aperture 114. For instance, ions following trajectory path 271 may strike the workpiece 100 at an angle of +θ° relative to the direction 118, which lies perpendicular to plane 151. Ions following trajectory path 270 may strike the workpiece 100 at about an angle of 0° relative to direction 118, while ions following trajectory path 269 may strike the workpiece 100 at an angle of −θ° relative to direction 118. Accordingly, the range of incident angles may be between +θ° and −θ° centered about 0°. In addition, some ion trajectories such as paths 269 and 271 may cross each other. Depending on a number of factors including, but not limited to, the horizontal dimension $W_2$ of gap 114, the vertical spacing (Z) of extraction plate 101 above substrate 100, the dielectric constant of the extraction plate 101, or other process parameters of the plasma 140, the range of incident angles (θ) may be between +60° and −60° centered about 0° with respect to direction 118.

As depicted in FIG. 4, plate 101 may be positioned along direction 118 at different vertical spacings (Z) above the plane 151 defined by the front (top) surface of the workpiece 100 in different embodiments. Depending on the separation Z, the shape and width W of ion beam 124 may vary. For example, at a separation $Z_3$ corresponding to plane 151a, ion beam 124 may first form a focus at point P and diverge to form a spread-out beam having a width G when it impacts substrate 100. On the other hand, if the separation is arranged to be at plane 151b, corresponding to focal plane P, the ion beam 124 may form a narrow beam width when impacting substrate 100. At a separation $Z_1$ corresponding to plane 151c, a convergent ion beam 124 may impact substrate 100 in a wider area than at point P, as illustrated. Beams extracted from apertures 112 and 116 may also vary in their widths corresponding to changes in separation Z between extraction plate 101 and substrate 100.

Figure 5:
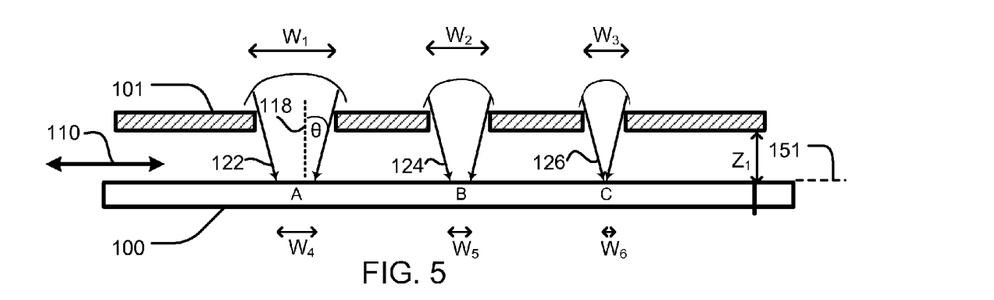
FIG. 5 depicts a cross-section of ion beams produced by an extraction plate embodiment having multiple apertures.

Furthermore, because the different apertures 112, 114, 116 may vary from one another in at least one aspect, at any given separation Z, the beams 122, 124, and 126 may also vary between each other at the surface of substrate 100. FIG. 5 depicts one embodiment of an extraction plate in which beams 122, 124, and 126 create different respective implant widths $W_4$, $W_5$, $W_6$ on workpiece 100. In addition to affecting beam implant widths, the variation in aperture properties between apertures 112, 114, and 116 may also result in other differences in beam properties between beams 122, 124, and 126, such as differences in current density and/or differences in ion trajectories. In particular, each beam may have a different distribution of angles of incidence θ of the ions (see FIG. 4 for one example of several ion trajectories) as they impact the workpiece 100. In accordance with some embodiments, parameters that may be adjusted to influence the distribution of ion trajectories within each beam may include the aperture widths $W_1$-$W_3$, the plasma power, gas pressure, plasma-workpiece bias, extraction plate-workpiece separation, among other factors.

Accordingly, as depicted in FIG. 5, at any given instant, the different regions A, B, C of workpiece 100 may be subject to substantially different ion bombardment conditions from respective ion beams 122, 124, and 126. By providing scanning along direction 110, the same area of workpiece 100 may be successively exposed to ion bombardment from beams 122, 124, and 126. As detailed further below, this combination of exposures to different ion beams may be tailored to achieve a desired substrate treatment.

Figure 6A:
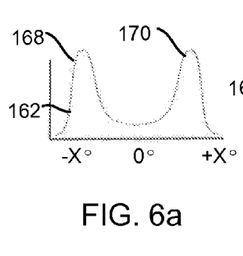
FIGS. 6a-c depict exemplary ion distribution curves that may be produced by a multi-aperture extraction plate embodiment.
Figure 6B:
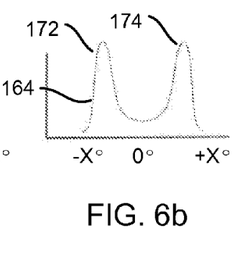
Figure 6C:
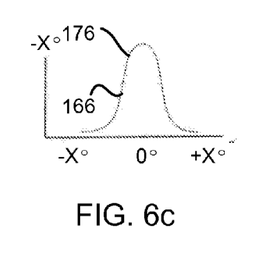

FIGS. 6a-c depict exemplary curves illustrating current density of ions as a function of angle, which may represent the distribution of ions over different incidence angles at a surface of workpiece 100 using three different aperture widths. Referring also to FIGS. 4 and 5, in one embodiment the curves 162, 164, 166 may correspond to the distribution of ions in ion beams 122, 124, 126 for an extraction plate-workpiece separation $Z_3$. The curves may represent the ion flux detected as a function of ion incidence angle with respect to a normal (parallel to direction 118) to the plane 151c of substrate 100. Curve 162 exhibits a wide range of angles of incidence from −X° to +X° that forms a bimodal distribution, in which two peaks 168 and 170 are distributed on either side of normal incidence angle (0°). This indicates that a larger fraction of ions impinge on workpiece 100 at angles substantially different from normal incidence. At normal incidence, the curve 162 shows a minimum, indicating that fewer normal incidence ions impinge upon the substrate 100 than ions incident at other angles. Curve 164, corresponding to ion beam 124 exhibits a qualitatively similar shape to that of curve 162, in that the distribution has two peaks 172 and 174. In this case, the peak separation may be smaller than for curve 162, indicating that the peak incidence angles 172, 174 are closer to normal than peaks 168 and 170. In contrast, curve 166 exhibits a single peak 176 centered at normal incidence.

Figure 7A:
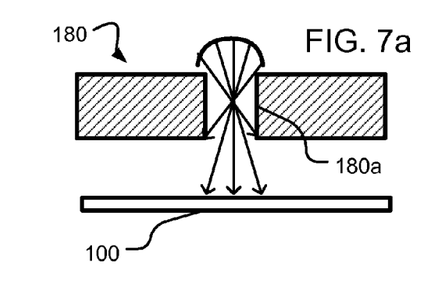
FIGS. 7a-c depict exemplary aperture cross-sections.
Figure 7B:
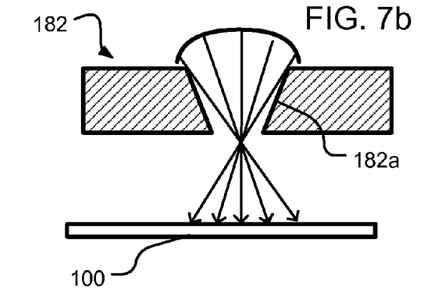
Figure 7C:
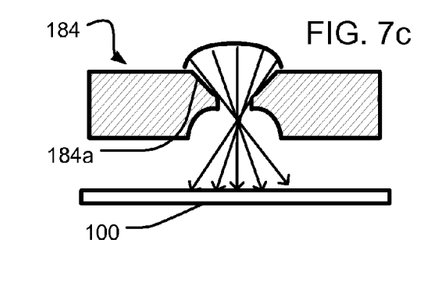

FIGS. 7a-c illustrate different embodiments of cross-sectional shapes for apertures that may be employed in multi-aperture extraction plate 101. Each aperture illustrated in FIGS. 7a-7c may, but need not, have a generally elongated shape in plan view, as depicted, for example, in FIG. 3. Aperture 180, which has a straight bore sidewall 180a, may be employed, for example, to reduce ion flux from glancing incidence angles, while aperture 182, having a beveled sidewall 182a, may be used to increase ion flux from glancing incidence angles. Aperture 184, having a bevel-and-arc shaped sidewall 184a, may be employed to reduce beam clipping. Consistent with various embodiments, any of the above aperture cross-sectional shapes may be employed in any of the apertures of a multi-aperture extraction plate, such as extraction plate 101.

In various embodiments of a multi-aperture extraction plate 101, in addition to—or instead of varying the aperture width between different apertures (as illustrated in FIGS. 3-5), the cross-sectional shape of apertures may be varied between apertures. Thus an embodiment of extraction plate 101 may comprise three apertures whose respective cross-sectional shapes are represented by those depicted in FIGS. 7a-c. In this embodiment, each aperture may provide an ion beam whose characteristics differ from those produced by the other two apertures.

Advantageously, an ion implantation system arranged in accordance with the present embodiments may treat a workpiece to multiple ion beams in which the ion distribution, beam width, and/or current density, among other factors, is varied between beams, as represented by FIGS. 5-7. By providing multiple different beams that may be applied to the same area of a workpiece in a single scan, the present embodiments facilitate novel ion treatment of workpieces. This may be used to control the temperature profile of a workpiece during ion implantation, to control the total distribution of angles of incidence of ions provided to a workpiece, and to provide complex patterning of a workpiece in which the ion beam focal point is varied in conjunction with other parameters, such as implantation duty cycle and/or scan speed.

Figure 8A:
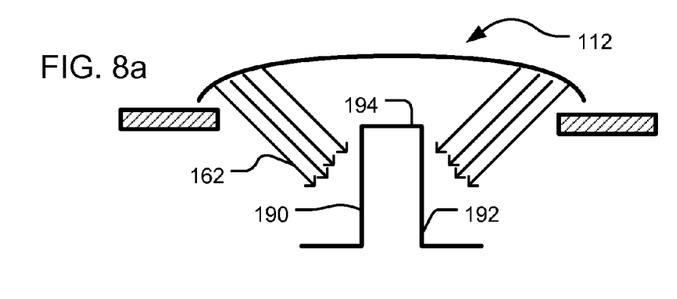
FIGS. 8a-c depict details of ion treatment of a substrate feature using respective wide, medium, and narrow apertures.
Figure 8B:
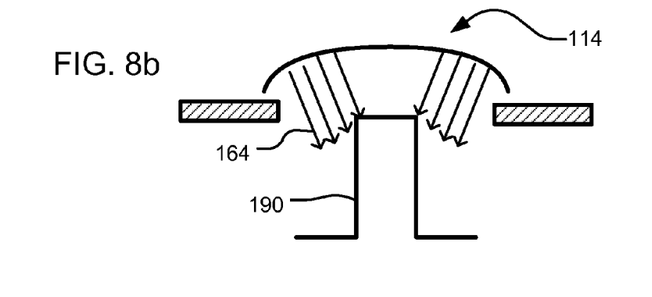
Figure 8C:
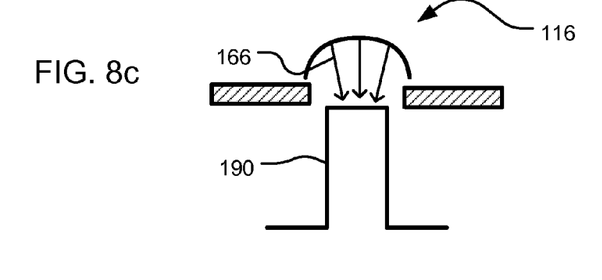
Figure 9A:
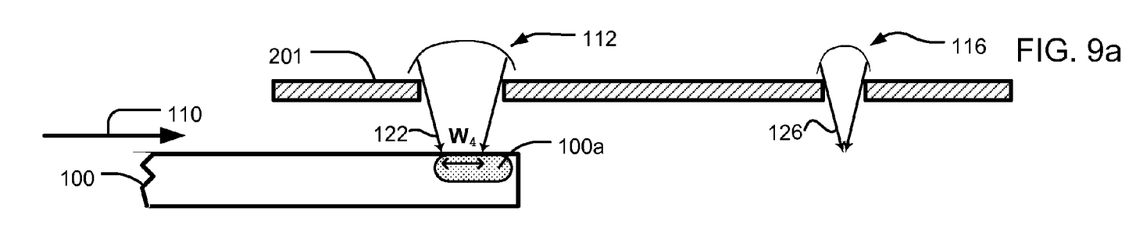
FIGS. 9a-d depict exemplary steps involved in a substrate processing method using a multi-aperture extraction plate embodiment.
Figure 9B:
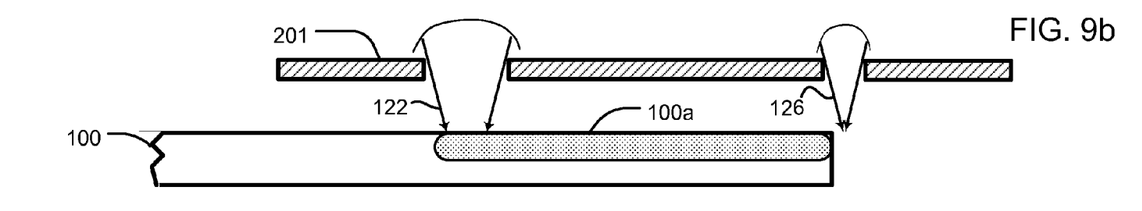
Figure 9C:
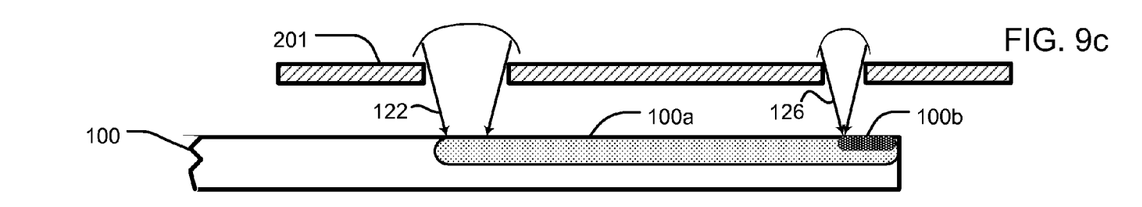
Figure 9D:
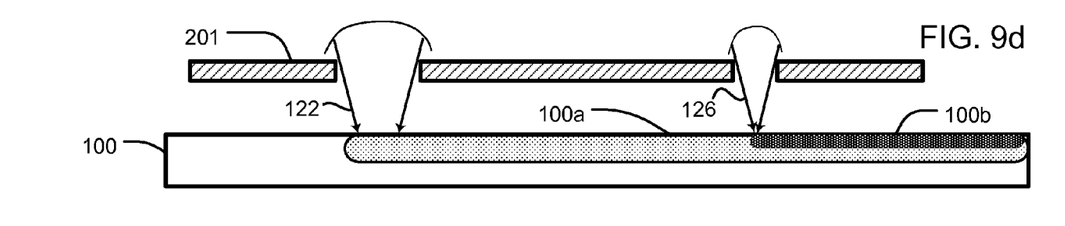

FIGS. 8a-c depict an embodiment of multi-aperture ion beam bombardment of a workpiece using a series of three apertures that may be arranged in a single extraction plate. In this example, a sequence of ion bombardment steps may be applied to a patterned substrate feature 190 by scanning apertures 112, 114, and 116 sequentially over the feature. Ions provided by apertures 112, 114, and 116 may impact feature 190 over respective angular distributions 162, 164, and 166, as described above and illustrated schematically in FIG. 9. The different distributions of ions may impact the sidewalls 192, and top 194 of patterned feature 190 differently, as illustrated. One advantage provided by this multiple ion beam bombardment is the ability to tailor the sequence of different exposures according to the desired impact on the substrate feature. Thus, it may be desirable to treat the sidewalls (and/or top) surfaces of a relief feature by more glancing incidence ions first (or last) in order to modify the surfaces of the relief feature. The multiple ion bombardment scheme afforded by the multiple apertures 112-116 may also provide a convenient means to optimize ion dose at different angles over a range of ion angles of incidence in a manner not possible using conventional ion implantation or using a single aperture type having a singular ion distribution.

In other embodiments, a multiple aperture extraction plate may be used to improve control of substrate temperature during ion implantation. For example, conventional ion implantation is known as a means to perform amorphizing implants in which crystalline material in a substrate is rendered amorphous using ion bombardment. In order to perform an improved amorphization process according to the present embodiment, an aperture, such as aperture 116, may be selected to provide a more focused ion beam 126 to a substrate 100, as depicted in FIG. 5. The more focused ion beam may cause an amorphization point in the substrate to be reached sooner. In order to avoid excessive thermal stresses that may otherwise be incurred using the more focused beam to amorphize the substrate, a defocused beam may be first provided to the area of the substrate to be amorphized.

FIGS. 9a-9d depict one embodiment of processing a substrate 100 using a multi-aperture extraction plate 201 to expose the substrate with two different ion beams. The first ion beam 122, provided through aperture 112, may form a broad implanted area of width $W_4$ at the substrate surface that provides gradual heating to the substrate 100 over a wide area. The second ion beam 126, provided through aperture 116, may form a narrow implanted area (not specifically shown) that amorphizes the substrate locally and may add additional localized heating to the substrate. As depicted in the FIGS. 9a-d, during implantation, substrate 100 may be scanned firstly under aperture 112, followed by scanning under aperture 116. At the instant depicted in FIG. 9a, substrate 100 is partially scanned under aperture 112, forming pre-heated region 100a. At FIG. 9b, substrate 100 has been further scanned under aperture 112, such that the preheated region 110a has expanded laterally. At FIG. 9c, substrate 100 has been partially scanned under aperture 116, forming amorphized zone 100b, which may be disposed within pre-heated zone 100a. At FIG. 9d, substrate 100a has been further scanned under aperture 116, resulting in an expansion of amorphized zone 100b. Because the amorphized zone 100b is formed within a preheated substrate region 100a, amorphization may take place without inducing deleterious thermal stresses. For example, the preheated zone 110a may provide a thermal profile in the substrate 100 that reduces any thermal gradient induced by heating from the amorphization processes caused by beam 126. In this manner, the two beams provided by extraction plate 201 interoperate to provide an improved substrate amorphization process.

In various embodiments, the scan rate of a workpiece with respect to extraction plate may be varied to provide further control of ion beam processing of a workpiece. For example, a workpiece of portion of a workpiece could be scanned at a first rate when exposed to a wide aperture and a second rate when exposed to a narrow aperture.

In various embodiments, application of bias between plasma and workpiece may be synchronized with the scanning of a workpiece under extraction plate, such as extraction plate 101. In one example, a wide aperture may be scanned to apply a blanket ion exposure to a substrate, while a narrow aperture is scanned over the substrate with an intermittently applied substrate bias voltage, such that only select areas of the substrate receive ions from the narrow aperture at the desired ion energy. Implantation may be further controlled using pulsing of substrate bias such that the duty cycle of the applied bias is varied according to the intended implantation profile for a substrate. For example, a first substrate bias voltage duty cycle may be applied using a first aperture that produces a first ion beam width and first angular distribution of ions, while a second substrate voltage duty cycle is applied using a second aperture that produces a second ion beam width and second angular distribution of ions. This may facilitate complex patterning of a workpiece by providing further control of the relative amount of exposure to different types of ion beams.

In various other embodiments, instead of using a single extraction plate, an extraction plate system may comprise a set of similar extraction plates arranged in series in a triode, pentode, or other configuration.

The methods described herein may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art includes such devices as a readable or writeable CD, flash memory chips (e.g., thumb drives), various magnetic storage media, and the like.

In particular, steps for varying the DC extraction voltage and/or workpiece scan rate may be performed at least partially by a combination of an electronic processor, computer readable memory, and/or computer readable program. The computer memory may be further configured to receive, display and store process history information associated with operation of a plasma system and as exemplified by the stored voltage values.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. An ion implantation system, comprising:
a plasma source for providing a plasma;
a workpiece holder arranged to receive a bias with respect to the plasma to attract ions across a plasma sheath toward a workpiece, the workpiece having a front surface defining a workpiece plane; and
an extraction plate arrangement having a plurality of apertures each arranged to provide an ion beam having ions distributed over a range of angles of incidence on the workpiece, wherein a first ion beam extracted from a first aperture has a first distribution of angles of incidence and a second ion beam extracted from a second aperture has a second distribution of angles of incidence that is different than the first distribution, wherein the first distribution of angles of incidence comprises a bimodal distribution of angles in which a current density of ions that impinge upon the workpiece is greater about a first and second peak angles as compared to a current density of ions that impinge upon the workpiece between the first and second peak angles.

2. The ion implantation system of claim 1, wherein the first aperture has a first width and the second has a second width which differs from the first width wherein each of the first and second apertures is configured to modify a local shape of the plasma sheath proximate that aperture.

3. The ion implantation system of claim 1, wherein, at a surface of the workpiece, a first beamwidth of the first beam differs from a second beamwidth of the second beam.

4. The ion implantation system of claim 1, wherein a first sidewall profile of the first aperture differs from a second sidewall profile of the second aperture.

5. The ion implantation system of claim 1, wherein a first sidewall profile of the first aperture and second sidewall profile of the second aperture are the same.

6. The ion implantation system of claim 4, wherein the first sidewall profile comprises one of a bevel; a straight through bore, and a bevel-and-arc.

7. The ion implantation system of claim 4, wherein the first and second sidewall profile comprise one of a bevel; a straight through bore, and a bevel-and-arc.

8. The ion implantation system of claim 1, wherein the second distribution of angles of incidence comprises a monomodal distribution of angles of incidence.

9. The ion implantation system of claim 1, wherein the first distribution of angles of incidence comprises a first bimodal distribution of angles of incidence having a first peak separation and the second distribution of angles of incidence comprises a second bimodal distribution of angles of incidence having a second peak separation.

10. The ion implantation system of claim 1, wherein the extraction plate arrangement and workpiece holder are scannable with respect to one another.

11. The ion implantation system of claim 1, wherein the extraction plate arrangement comprising a multiplicity of extraction plates arranged in series.

12. The ion implantation apparatus of claim 1, wherein the extraction plate arrangement comprising a single extraction plate, wherein the single extraction plate includes the first and second apertures.

13. The ion implantation apparatus of claim 1, wherein the workpiece holder being biased at ground potential and the plasma being biased at a different potential than ground potential.

14. A method of processing a substrate comprising:
providing a first ion beam having a first distribution of angles of incidence on the substrate, the substrate having a front surface defining a substrate plane; and
providing a second ion beam having a second distribution of angles of incidence on the substrate wherein the first distribution is different than the second distribution and the first and second ion beams are provided to the substrate without breaking vacuum in a process chamber containing the substrate, wherein the first distribution of angles of incidence comprises a bimodal distribution of angles in which a current density of ions that impinge upon the substrate is greater about a first and second peak angles as compared to a current density of ions that impinge upon the substrate between the first and second peak angles.

15. The method of claim 14, wherein the providing the first and second ion beams comprising providing an extraction plate adjacent to a plasma chamber containing a plasma, the extraction plate configured with first and second apertures arranged to modify a shape of a plasma sheath adjacent the extraction plate.

16. The method of claim 15, comprising providing the first aperture with a first width differing from a second width of the second aperture.

17. The method of claim 16, comprising scanning the first and second ion beams with respect to a plane of the substrate.

18. The method of claim 17, comprising scanning the first and second ion beams over a same region of the substrate.

19. The method of claim 14, wherein the second distribution of angles of incidence comprises a monomodal distribution of angles of incidence.

20. The method of claim 14, wherein the first and second ion beams are provided sequentially to the substrate.

* * * * *